United States Patent
Higuchi (10) Patent No.: US 6,833,614 B2
(45) Date of Patent: Dec. 21, 2004

(54) SEMICONDUCTOR PACKAGE AND SEMICONDUCTOR DEVICE

(75) Inventor: Tsutomu Higuchi, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 10/644,852

(22) Filed: Aug. 21, 2003

(65) Prior Publication Data

US 2004/0036169 A1 Feb. 26, 2004

(30) Foreign Application Priority Data

Aug. 23, 2002 (JP) .................................... 2002-243595
Jun. 16, 2003 (JP) .................................... 2003-170953

(51) Int. Cl.[7] .............................................. H01L 23/52
(52) U.S. Cl. ..................... 257/691; 257/693; 257/706; 257/783; 257/787
(58) Field of Search ........................ 257/691, 693, 257/701, 702, 706, 775, 783, 787

(56) References Cited

U.S. PATENT DOCUMENTS

| | | | | |
|---|---|---|---|---|
| 5,391,914 A | * | 2/1995 | Sullivan et al. | 257/635 |
| 5,638,596 A | * | 6/1997 | McCormick | 29/827 |
| 5,665,473 A | * | 9/1997 | Okoshi et al. | 428/457 |
| 6,008,534 A | * | 12/1999 | Fulcher | 257/691 |
| 6,201,298 B1 | * | 3/2001 | Sato et al. | 257/691 |
| 6,335,566 B1 | * | 1/2002 | Hirashima et al. | 257/686 |
| 6,717,248 B2 | * | 4/2004 | Shin et al. | 257/678 |
| 2003/0151133 A1 | * | 8/2003 | Kinayman et al. | 257/713 |
| 2003/0165051 A1 | * | 9/2003 | Kledzik et al. | 361/760 |

FOREIGN PATENT DOCUMENTS

JP 2000-183224 * 6/2000 ........... H01L/23/12

* cited by examiner

*Primary Examiner*—Jasmine Clark
(74) *Attorney, Agent, or Firm*—Armstrong, Kratz, Quintos, Hanson & Brooks, LLP (57) ABSTRACT

There is provided a semiconductor package that includes a metal plate, and a wiring substrate having an insulating substrate, signal wiring layer formed on one surface of the insulating substrate, and a ground plane formed integrally on other surface of the insulating substrate, whereby a surface of the ground plane side of the wiring substrate is adhered onto the metal plate. The signal wiring layer is constructed by a wiring line portion and a connection pad portion whose width is thicker than a width of the wiring line portion, and non-forming portion is provided in portion of the ground plane, which corresponds to the connection pad portion. In addition, a recess portion may be formed in portion of the metal plate, which correspond to the non-forming portion.

21 Claims, 12 Drawing Sheets

SEMICONDUCTOR PACKAGE AND SEMICONDUCTOR DEVICE

BACKGROUND OF THE INVENTION

1. Field of the Invention

The present invention relates to a semiconductor package and a semiconductor device and, more particularly, a semiconductor package of FBGA (Fine Pitch Ball Grid Array) type, or the like employed in the high frequency application, and a semiconductor device in which a semiconductor chip is packaged in the semiconductor package.

2. Description of the Related Art

Figure 1:
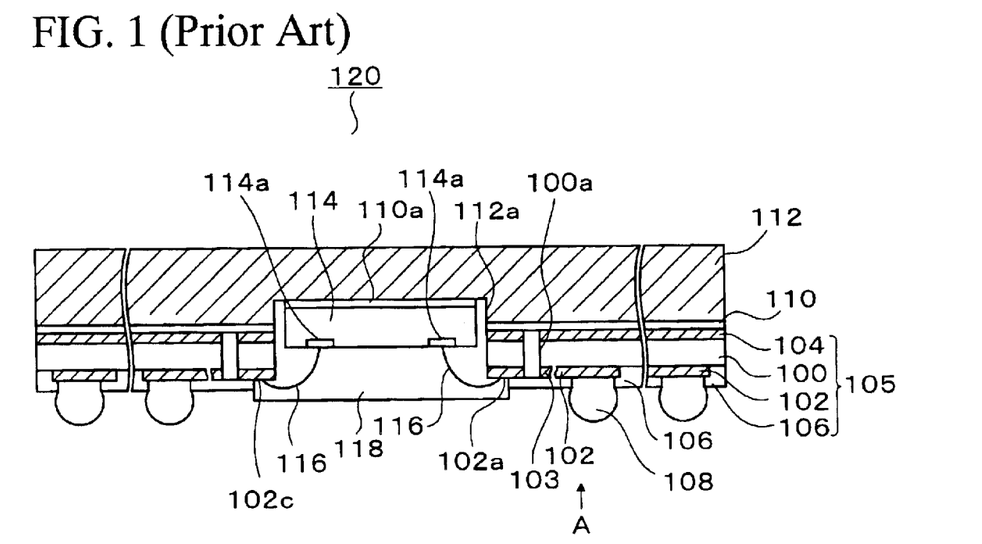
FIG. 1 is a sectional view showing a semiconductor device having the FBGA type structure in the related art.
Figure 2:
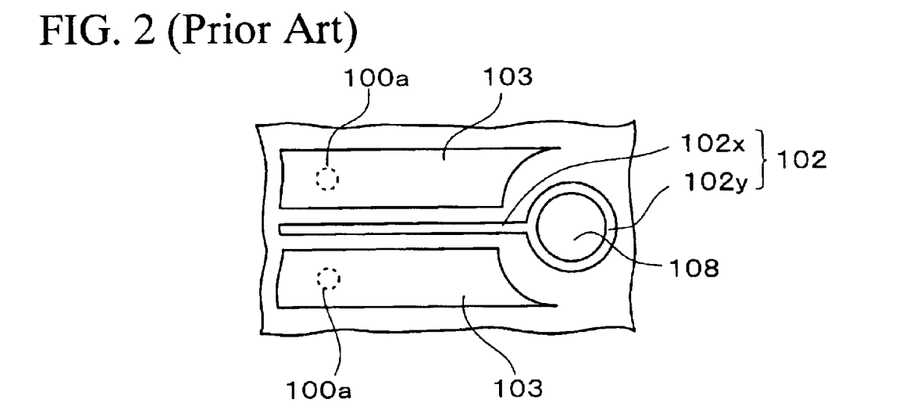
FIG. 2 is partial plan view viewed from an A portion in FIG. 1.

In recent years, in the high-frequency application semiconductor device employed in the telecommunication apparatus, etc., the signal speed is being increased highly, and such higher speed of the signal is restricted by the disturbance in the signal waveform. For this reason, the semiconductor device that can suppress the disturbance in the signal waveform even when the higher speed signal is applied is desired. Such semiconductor device has the FBGA type structure using two metal wiring substrates, for example. FIG. 1 is a sectional view showing a semiconductor device having the FBGA type structure in the related art, and FIG. 2 is partial plan view viewed from an A portion in FIG. 1.

As shown in FIG. 1, in a semiconductor device 120 of the FBGA package type in the related art, signal wiring layers 102 are formed on one surface of an insulating film 100, and a ground plane 104 is formed on the other surface to spread over the entire surface. The signal wiring layers 102 are covered with a solder resist film 106 except their bump connection portions. In this manner, a wiring substrate 105 is basically constructed. Then, solder balls 108 are mounted on the bump connection portions of the signal wiring layers 102 respectively.

A surface of the wiring substrate 105 on the ground plane 104 side is adhered to a peripheral portion of a stiffener 112 (radiating plate and reinforcing plate), to a center portion of which a cavity 112a is provided, via an adhesive layer 110 so as to avoid the cavity 112a. Also, the back surface side of a semiconductor chip 114 having connection electrodes 114a thereon is adhered to a bottom portion of the cavity 112a of the stiffener 112 by die bonding material 110a.

The connection electrodes 114a of the semiconductor chip 114 and wire bonding pads 102a of the signal wiring layers 102 on the wiring substrate 105 are connected via wires 116. In addition, the semiconductor chip 114, the wires 116, and the wire bonding pads 102a of the signal wiring layers 102 are sealed by a sealing resin 118.

Also, as shown in FIG. 2, if the signal wiring layers 102 in FIG. 1 are viewed from the A portion, the signal wiring layer 102 consists of a wiring line portion 102x and a connection pad portion 102y. The wiring line portion 102x is formed to have an almost identical wiring width over the entire transmission path. While, a diameter of the connection pad portion 102y is formed thicker than the wiring width of the wiring line portion 102x because the solder ball 108 having a relatively large diameter is placed on the connection pad portion 102y.

In addition, ground wiring layers 103 are formed adjacently on both sides of plural signal wiring layers 102. The ground wiring layers 103 are connected electrically to the ground plane 104 via through holes 100a. As described above, the semiconductor device 120 having the FBGA package structure in the related art is basically constructed.

In the wiring substrate 105 of the above semiconductor device 120, it is possible to design the wiring line portion 102x of the signal wiring layer 102 such that, if the wiring width of the wiring line portion 102x is arranged to have the almost identical width over the overall transmission path, the electrostatic capacity between the wiring line portion 102x and the ground plane 104, etc. can be set almost identically.

In addition, the ground wiring layers 103 can be arranged near the signal wiring layer 102 in such a manner that space portions are set almost equal. In this fashion, since the impedance matching can be implemented in the wiring line portion 102x, a transfer loss of the signal is seldom generated.

However, because the solder ball 108 is mounted on the connection pad portion 102y, the connection pad portion 102y of the signal wiring layer 102 is arranged to have a larger width than the wiring width of the wiring line portion 102x. Therefore, the electrostatic capacity between the wiring line portion 102x and the ground plane 104 becomes different from the electrostatic capacity between the connection pad portion 102y and the ground plane 104, so that the impedance matching is largely lost. As a result, there is such a problem that the transfer loss of the signal is generated and thus the transfer characteristic at a desired frequency cannot be obtained.

Also, in the case that the conventional semiconductor device 120 is packaged in the packaging substrate, if the stress is applied to the semiconductor device 120 from the horizontal direction, such stress is concentrated to jointed portions of the solder balls 108 in the semiconductor device 120. Thus, it is possible that the signal wiring layers 102 jointed to the solder balls 108, etc. are disconnected.

SUMMARY OF THE INVENTION

It is an object of the present invention to provide a semiconductor package that can cause the overall transmission path to match the impedance and also generates no trouble when stress is applied on packaging such package in a packaging substrate, and a semiconductor device in which a semiconductor chip is packaged in the semiconductor package.

The present invention provides a semiconductor package which comprises a metal plate; and a wiring substrate having an insulating substrate, signal wiring layer formed on one surface of the insulating substrate, and a ground plane formed integrally on other surface of the insulating substrate, whereby a surface of the wiring substrate on a ground plane side is adhered onto the metal plate; wherein the signal wiring layer is constructed by a wiring line portion and a connection pad portion whose width is thicker than a width of the wiring line portion, and a non-forming portion is provided in portion of the ground plane, which corresponds to the connection pad portion.

In the present invention, in order to attain the impedance matching between the wiring line portion of the signal wiring layer and the connection pad portion whose width is larger than that of the wiring line portion, the non-forming portion is provided by removing from a portion of the ground plane, which corresponds to the connection pad portion.

In one preferred embodiment of the present invention, the metal plate and the wiring substrate are adhered mutually by the resin layer. The non-forming portion of the ground plane may be formed as a hollow, or may be filled with the resin layer respectively. Otherwise, the non-forming portion of the ground plane may be formed as a hollow, and a resin layer may be interposed between the non-forming portion and the metal plate.

The electrostatic capacity, which is formed between the wiring line portion and the ground plane, and the electrostatic capacity, which is formed between the connection pad portion and the metal plate, are made equal by adjusting a thickness of the non-forming portion of the ground plane, a thickness of the resin layer, or both thicknesses. According to this, the impedance matching is obtained between the wiring line portion and the connection pad portion.

Also, in one preferred embodiment of the present invention, a recess portion may be further provided in a portion of the metal plate corresponding to the non-forming portion of the ground plane. In this case, a depth of the recess portion is set to attain the impedance matching between the wiring line portion and the connection pad portion.

Also, in the wiring substrate that is adhered to the metal plate not to provide the ground plane on the other surface of the insulating substrate, similarly the impedance matching can be obtained between the wiring line portion and the connection pad portion by providing predetermined recess portion in a portion of the metal plate corresponding to the connection pad portion.

Also, in one preferred embodiment of the present invention, the semiconductor package further comprises ground wiring layer formed on one surface of the insulating substrate adjacently to the signal wiring layer; and wherein the ground wiring layer, the ground plane, and the metal plate may be electrically connected mutually to constitute an integral equal-potential ground. As a result, variation in the ground potential can be suppressed and the impedance matching can be obtained in its stable state.

Also, the present invention provides a semiconductor package which comprises a metal plate; and a wiring substrate including a film substrate, and a signal wiring layer formed on a one surface of the film substrate and the signal wiring layer having connection pad portion that is joined to a bump, whereby another surface of the film substrate is adhered onto the metal plate; wherein stresses applied to the bump are relaxed by providing a recess portion in a portion of the metal plate, which correspond to the connection pad portions.

In the case that the stress is applied to the semiconductor device in the horizontal direction after the semiconductor device having the semiconductor package of the present invention is mounted on the packaging substrate, if the recess portion is provided in the portion of the metal plate corresponding to the connection pad portion, the stress that concentrated onto the bump can be absorbed by the film substrate because the film substrate having the flexibility is bent and deformed.

Therefore, even when the stress is applied to the bump from the horizontal direction, the disadvantages such that the crack is generated in the signal wiring layer containing the connection pad portion, which are jointed to the bump, to disconnect the wiring, etc. can be prevented from being generated.

DETAILED DESCRIPTION OF THE PREFERRED EMBODIMENTS

Embodiments of the present invention will be explained with reference to the accompanying drawings hereinafter.

(First Embodiment)

Figure 3:
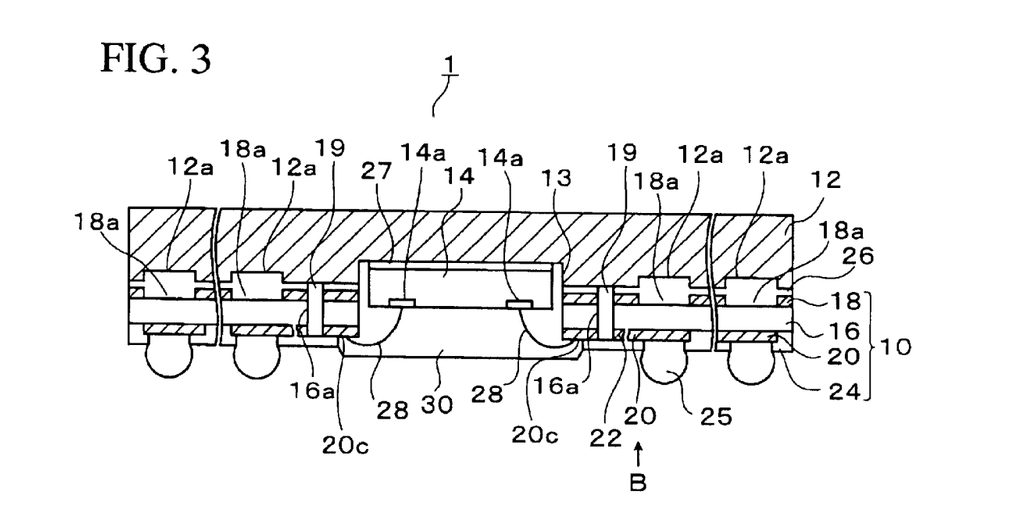
FIG. 3 is a sectional view showing a semiconductor package (semiconductor device) according to a first embodiment of the present invention.
Figure 4:
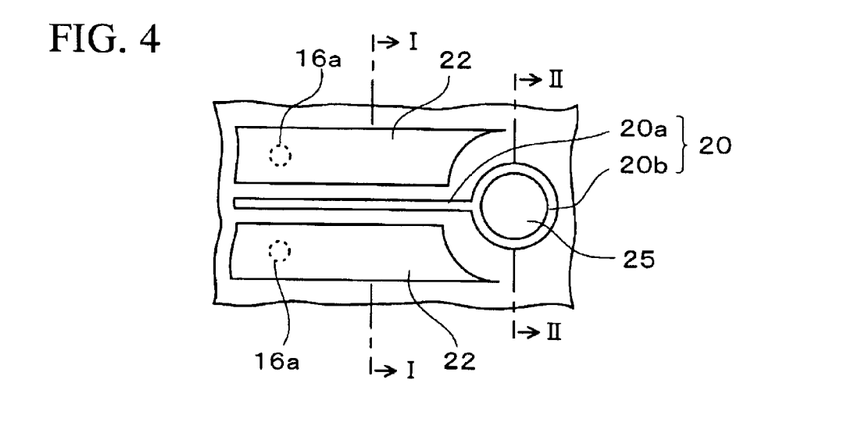
FIG. 4 is partial plan view viewed from the B direction in FIG. 3.
Figure 5:
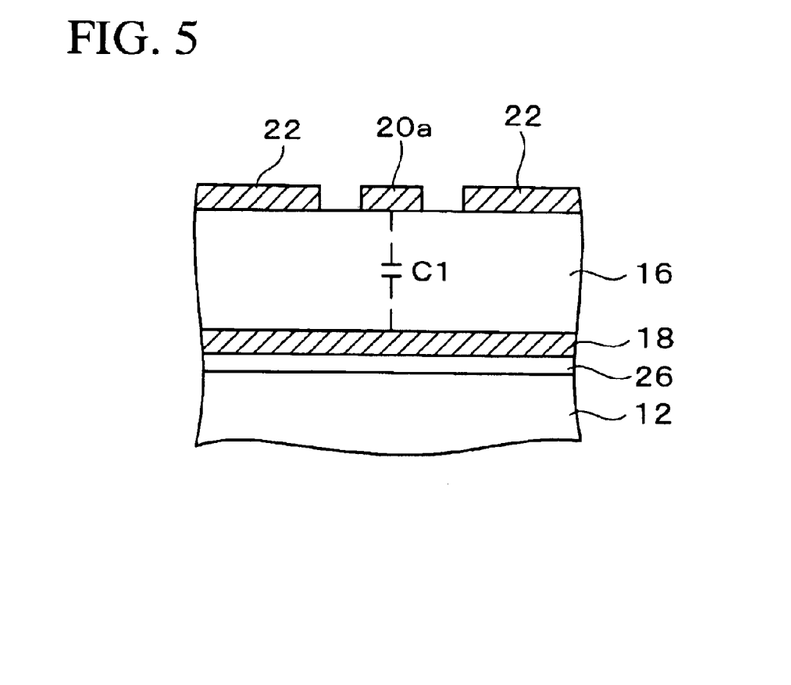
FIG. 5 is sectional view taken along a I—I line in FIG. 4.
Figure 6:
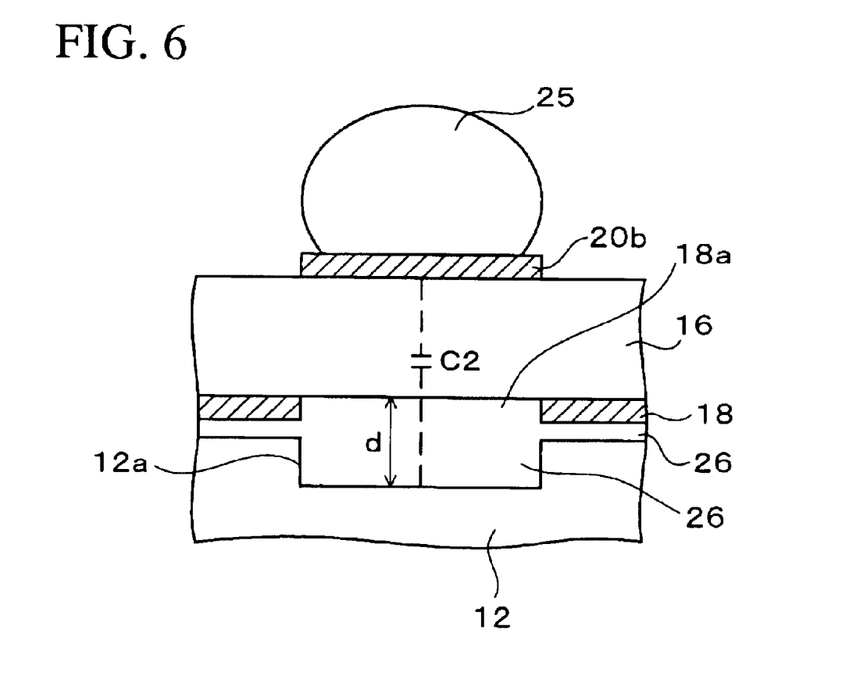
FIG. 6 is sectional view taken along a II—II line in FIG. 4.
Figure 7:
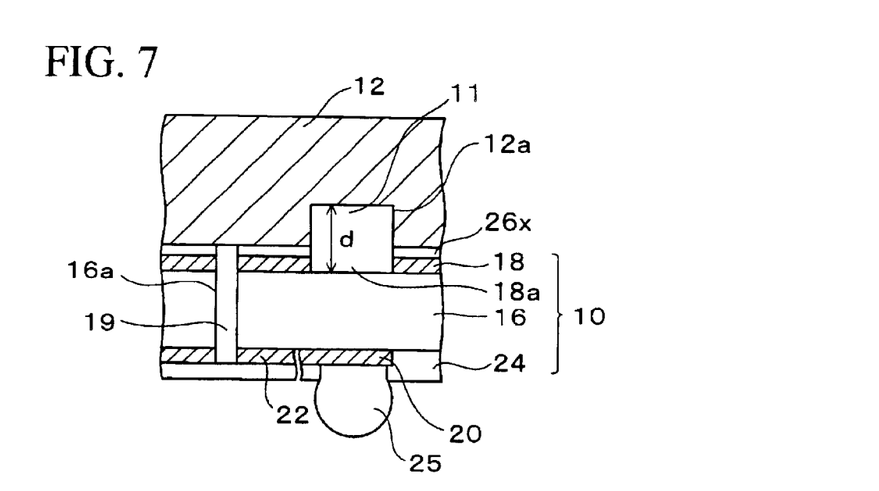
FIG. 7 is a partial sectional view showing a mode in which a hollow portion is provided in a recess portion of a stiffener according to the semiconductor package of the first embodiment of the present invention.
Figure 8:
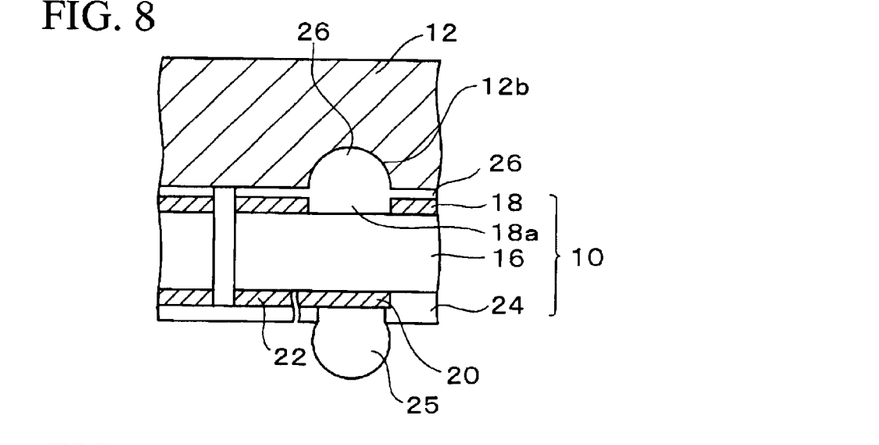
FIG. 8 and FIG. 9 are partial sectional views showing a variation of the recess portion shape of the stiffener according to the semiconductor package of the first embodiment of the present invention respectively.

FIG. 3 is a sectional view showing a semiconductor package (semiconductor device) according to a first embodiment of the present invention, FIG. 4 is partial plan view viewed from the B direction in FIG. 3, FIG. 5 is sectional view taken along a I—I line in FIG. 4, FIG. 6 is sectional view taken along a II—II line in FIG. 4, FIG. 7 is a partial sectional view showing a mode in which a hollow portion is provided in a recess portion of a stiffener according to the same semiconductor package, and FIG. 8 is a partial sectional view showing a variation of the recess portion shape of the stiffener according to the same semiconductor package.

As shown in FIG. 3, the semiconductor package of the first embodiment of the present invention constitutes a semiconductor device 1, and is constructed basically by a wiring substrate 10 and a stiffener 12 (metal plate). A semiconductor chip 14 is packaged in this semiconductor package to constitute the semiconductor device 1. In the wiring substrate 10, signal wiring layers 20 are formed as patterns on one surface of an insulating film 16 (insulating substrate) made of a resin such as polyimide, epoxy, or the like, and a ground plane 18 is formed on the other surface to spread over the entire surface except predetermined portions.

As shown in FIG. 4, this signal wiring layer 20 consists of a wiring line portion 20a and a connection pad portion 20b on which a solder ball 25 is mounted. Also, ground wiring layers 22 are provided adjacently at a predetermined interval on both sides of plural signal wiring layers 20 respectively. The signal wiring layers 20, the ground wiring layers 22, and the ground plane 18 are made of a metal layer such as copper (Cu), or the like.

Also, a solder resist film 24 having opening portions on bump connection portions of the signal wiring layers 20, etc. is formed on the signal wiring layers 20 and the ground wiring layers 22. In this manner, the wiring substrate 10 is constructed basically. A surface of the wiring substrate 10 on the ground plane 18 side is adhered to a peripheral portion of the stiffener 12 except its center portion via a resin layer 26. Then, the solder balls 25 (bumps) are mounted on the bump connection portions of the signal wiring layers 20 on the wiring substrate 10. This stiffener 12 is made of metal such as copper, copper alloy, aluminum, or the like, and normally the stiffener 12 is also used as a radiating plate and a supporting plate.

A cavity 13 serving as a chip loading portion is provided in the center portion of the stiffener 12. The back surface side of the semiconductor chip 14 having connection electrodes 14a is adhered to a bottom portion of the cavity 13 by die bonding material 27. Then, the connection electrodes 14a of the semiconductor chip 14 and bonding pad portions 20c of the signal wiring layers 20 on the wiring substrate 10 are connected via wires 28. In addition, the semiconductor chip 14, the wires 28, the bonding pad portions 20c of the signal wiring layers 20, etc. are sealed by a sealing resin 30.

The semiconductor package of the first embodiment of the present invention is invented in view of the fact that, in the wiring line portions 20a and the connection pad portions 20b of the signal wiring layers 20 constituting the wiring substrate 10, the wiring line portions 20a are connected to the connection pad portions 20b, which have a width thicker than that of the wiring line portion 20a, and thus the impedance matching cannot be attained between them, and a transfer loss of a signal is generated.

In other words, as shown in FIG. 3, FIG. 4, and FIG. 6, in the semiconductor package of the present embodiment, non-forming portions 18a in which the ground plane 18 is partially removed are provided in portions of the ground plane 18, which correspond to the connection pad portions 20b of the signal wiring layers 20. In addition to this, recess portions 12a whose depth is adjusted to attain the impedance matching are provided to portions of the stiffener 12, which correspond to the non-forming portions 18a of the ground plane 18. Then, a resin layer 26 is filled in the recess portions 12a of the stiffener 12. This resin layer 26 also has a function of adhering the wiring substrate 10 to the stiffener 12. When the stiffener 12 and the wiring substrate 10 are adhered to each other via the resin layer 26, such resin layer 26 is pushed and then filled into the recess portions 12a.

In this fashion, as shown in FIG. 5 and FIG. 6, an electrostatic capacity C1 formed by the wiring line portion 20a of the signal wiring layer 20 and the ground plane 18 is set equal to an electrostatic capacity C2 formed by the connection pad portion 20b of the signal wiring layer 20 and the stiffener 12. According to this, the impedance matching can be obtained between the wiring line portion 20a and the connection pad portion 20b of the signal wiring layer 20. Thus, the signal can be transmitted at a desired frequency without loss over the entire signal transmission path. For example, the stable transmission characteristic can be obtained in the wide bandwidth that spreads over 40 GHz or more.

The optimum value of a depth of the recess portion 12a, which attains the impedance matching, is different based on a relative dielectric constant and a thickness of the insulating film 16, a relative dielectric constant of the resin layer 26 filled in the recess portion 12a, a diameter and a thickness of the connection pad portion 20b of the signal wiring layer 20, etc. In other words, while meeting design rules of various semiconductor packages, the depth of the recess portion 12a is adjusted appropriately to get the impedance matching between the wiring line portion 20a and the connection pad portion 20b.

For example, if a thickness of the insulating film 16: 0.05 mm, a relative dielectric constant of the insulating film 16: 3.2, a thickness of the connection pad portion 20b of the signal wiring layer 20: 0.018 mm, a diameter of the connection pad portion 20b: 0.60 mm, a relative dielectric constant of the resin layer 26: 3.2, and a shape of the recess portion: cylindrical shape are set, a depth including the recess portion 12a (d in FIG. 6), i.e., a depth from the insulating film 16 to a bottom surface of the recess portion 12a is given as about 0.21 mm. In this case, the impedances of the wiring line portion 20a and the connection pad portion 20b of the signal wiring layer 20 become 50 Ω and thus the impedance matching can be obtained.

In this case, as the resin layer 26 filled in the recess portion 12a of the stiffener 12, dielectric material having the almost same relative dielectric constant as the above insulating film 16 may be employed, or dielectric material having the relative dielectric constant different from the insulating film may be employed.

Alternatively, as shown in FIG. 7, a mode in which that no substance is filled in the recess portion 12a of the stiffener 12 and a hollow portion 11 is formed may be employed. In this case, the stiffener 12 and the wiring substrate 10 are adhered to each other by an adhesive sheet 26x. Opening portions corresponding to the recess portions 12a of the stiffener 12 are provided in the adhesive sheet 26x. Then, the adhesive sheet 26x is pasted on the stiffener 12 or the wiring substrate 10, and then the stiffener 12 and the wiring substrate 10 are adhered such that the recess portions 12a coincide with the opening portions of the adhesive sheet 26x.

If the mode in which the hollow portion 11 is provided in the recess portion 12a of the stiffener 12 in this manner is employed, the relative dielectric constant of the resin layer 26 may be replaced with the dielectric constant (1) of an air in calculation. Therefore, if remaining conditions are identical to the above conditions, a depth including the recess portion 12a (d in FIG. 7), i.e., a depth from the insulating film 16 to the bottom surface of the recess portion 12a may be set to about 0.13 mm.

Figure 9:
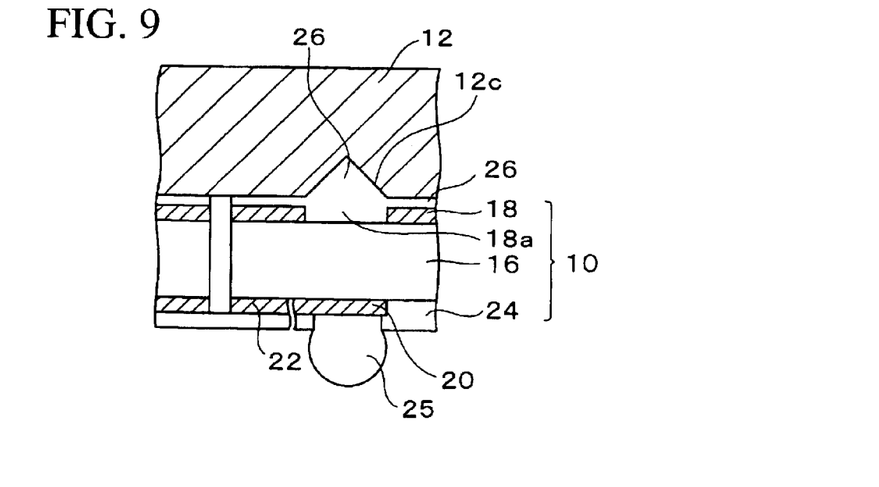

Also, in addition to the cylindrical recess portion 12a shown in FIG. 7, a shape of the recess portion 12a formed in the stiffener 12 may be formed as a hemispherical recess portion 12b shown in FIG. 8, a cone-type recess portion 12c shown in FIG. 9, or the like. The modes in which the resin layer 26 is filled in the recess portion 12a of the stiffener 12 are shown in FIG. 8 and FIG. 9.

In this case, if it is possible that the precise impedance matching cannot be obtained because electric lines of force spread laterally from a peripheral portion of the connection pad portion 20b of the signal wiring layer 20, it is preferable that the hemispherical recess portion 12b shown in FIG. 8 should be formed. This is because the influence of the electric line of force is corrected by the hemispherical recess portion 12b and thus the precise impedance correction can be obtained.

The cylindrical recess portion 12a in FIG. 7 is obtained by machining a surface layer portion of the stiffener 12 by the end mill. Also, the hemispherical recess portion 12b in FIG. 8 is obtained by etching selectively the surface layer portion of the stiffener 12. Also, the cone-type recess portion 12c in FIG. 9 is obtained by machining the surface layer portion of the stiffener 12 by the drill having a sharp tip portion.

Also, in the semiconductor package of the present embodiment, as shown in FIG. 3 and FIG. 7, through holes 16a used to connect electrically a ground wiring layer 22, the ground plane 18 and the stiffener 12 are formed. Such through holes 16a are formed by pasting a protection sheet (not shown) on a surface of the wiring substrate 10 of the signal wiring layer 20 side and then machining the protection sheet, the signal wiring layer 20, the insulating film 16, the ground plane 18 and the resin layer 26 by the drill, or the like, after the wiring substrate 10 is adhered to the stiffener 12 (before the solder balls 25 are mounted). Then, conductive paste 19 (conductor) such as silver paste, or the like is filled in the through holes 16a and then the protection sheet is peeled off.

In this manner, the ground wiring layer 22 provided next to the signal wiring layers 20 is connected electrically not only to the ground plane 18 but also to the stiffener 12 via the conductive paste 19 filled in the through holes 16a. That is to say, the ground wiring layer 22, the ground plane 18, and the stiffener 12 are set to the identical potential, and thus they can serve as an integral ground that has a larger area. As a result, variation in the ground potential can be suppressed and the impedance can be stabilized.

Figure 10:
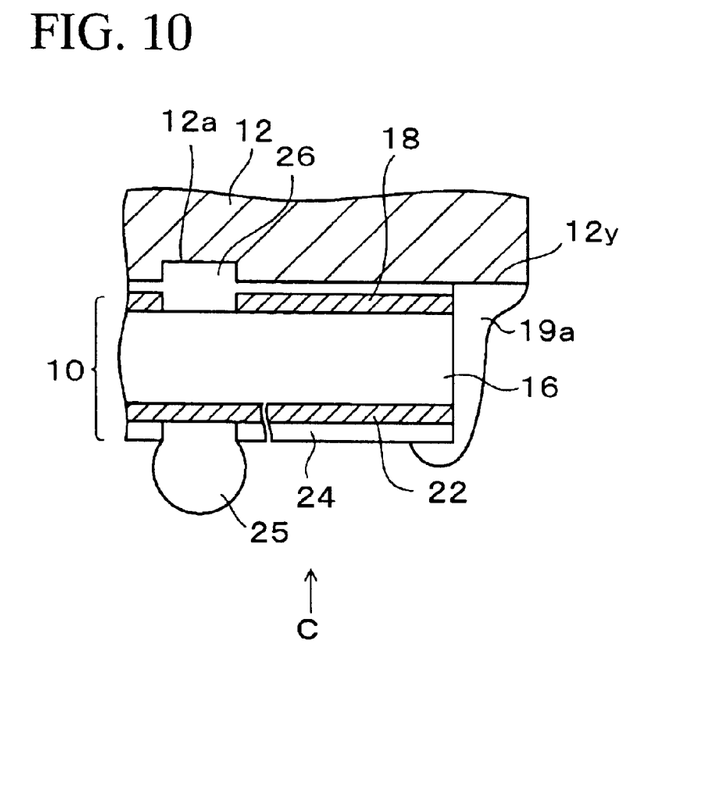
FIG. 10 is a partial sectional view showing a variation of the semiconductor package of the first embodiment of the present invention.

In this case, following modes may be employed in place of the electrical connection between the ground wiring layer 22 and the ground plane 18 and the stiffener 12 via the through holes 16a. FIG. 10 is a partial sectional view showing a variation of the semiconductor package according to the first embodiment of the present invention, and FIG. 11 is a partial plan view viewed from the C direction in FIG. 10.

Figure 11:
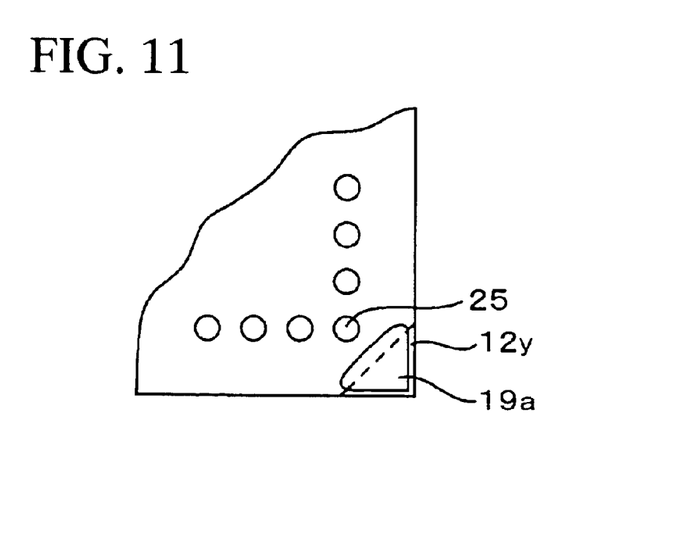
FIG. 11 is a partial plan view viewed from the C direction in FIG. 10.

In the variation of the semiconductor package of the present embodiment, as shown in FIG. 10 and FIG. 11, side surfaces of termination portions of the ground wiring layer 22 and the ground plane 18 are exposed from a side wall of an end portion of the wiring substrate 10. A projected portion 12y, which is projected from the wiring substrate 10, is provided in this portion of the stiffener 12. Then, the conductive paste 19 (conductor) is extended up to the projected portion 12y of the stiffener 12 to cover the side surface of the wiring substrate 10.

In this way, a structure in which the ground wiring layer 22 is connected electrically to the ground plane 18 and the stiffener 12 can be formed. In this variation, since there is no necessity to particularly form the through holes 16a, the ground wiring layer 22, the ground plane 18, and the stiffener 12 can be connected electrically by a simple method to constitute a ground having the equal potential.

As described above, in the semiconductor package of the present embodiment, in order to get the impedance matching between the wiring line portion 20a and the connection pad portion 20b of the signal wiring layer 20, the non-forming portions 18a in which the ground plane 18 is removed partially are provided in portions of the ground plane 18, which correspond to the connection pad portions 20b of the signal wiring layers 20. In addition, the recess portions 12a whose depth is adjusted to attain the impedance matching are provided to portions of the stiffener 12, which correspond to the non-forming portions 18a. Then, the resin layer 26 having the predetermined relative dielectric constant is filled in the recess portions 12a, otherwise the recess portions 12a is formed in the state that the hollow portion 11 is provided in the recess portion. Also, the ground wiring layer 22 is connected electrically to the ground plane 18 and the stiffener 12 to constitute the equal potential ground.

With the above, the impedance matching can be attained in its stable state over the entire transmission path of the wiring substrate 10 of the semiconductor device 1.

(Second Embodiment)

Figure 12:
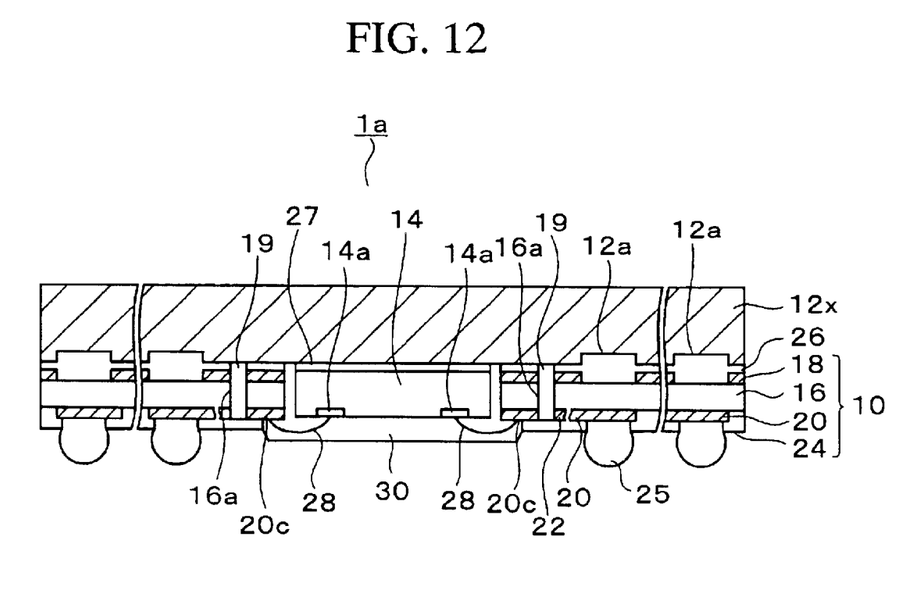
FIG. 12 is a sectional view showing a semiconductor package (semiconductor device) according to a second embodiment of the present invention.

FIG. 12 is a sectional view showing a semiconductor package (semiconductor device) according to a second embodiment of the present invention. As shown in FIG. 12, in a semiconductor device 1a of the second embodiment, a flat-plate stiffener 12x in which no cavity is formed is employed, and the semiconductor chip 14 is adhered to a chip mounting portion in its center. Then, the wiring substrate 10 having the same structure as the above structure adhered to a peripheral portion of the stiffener 12x except the chip mounting portion. Since remaining elements in the second embodiment are similar to those in the semiconductor device 1 in FIG. 3 in the first embodiment, their explanation will be omitted herein. In this case, there may be employed the modes in which various modifications and variations that are similar to the first embodiment are applied.

(Third Embodiment)

Figure 13:
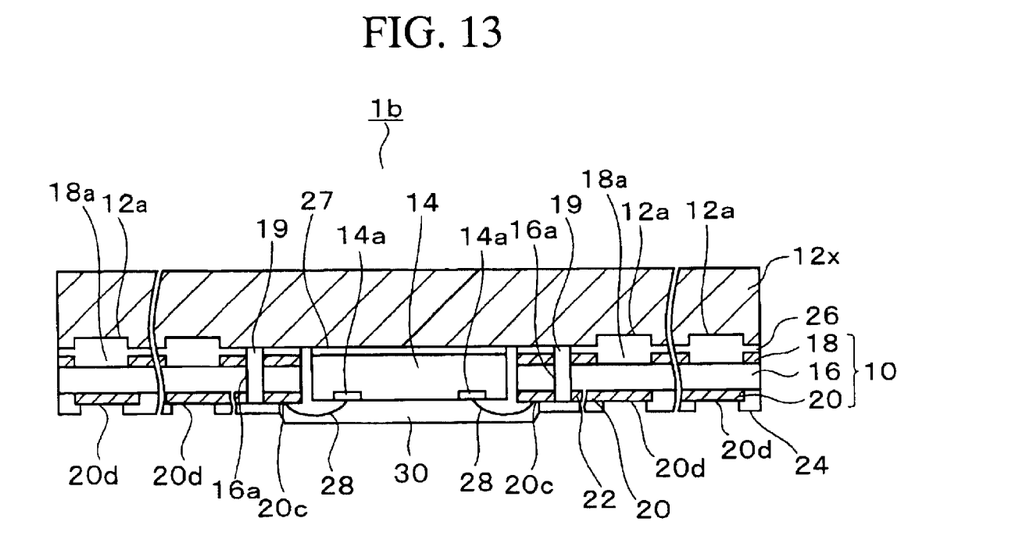
FIG. 13 is a sectional view showing a semiconductor package (semiconductor device) according to a third embodiment of the present invention.

FIG. 13 is a sectional view showing a semiconductor package (semiconductor device) according to a third embodiment of the present invention. As shown in FIG. 13, in a semiconductor device 1b of the third embodiment, the semiconductor device that has the LGA (Land Grid Array) type package structure by omitting the solder balls 25 of the semiconductor device 1a of the second embodiment is constructed. In this case, the solder balls are mounted on the wiring pads on the packaging substrate (mother board) side, and such solder balls are jointed to bump connection portions 20d of the signal wiring layers 20 on the wiring substrate 10. In this case, the LGA type structure may be employed by omitting the solder balls 25 of the semiconductor device 1 in the first embodiment.

Since remaining elements in the second embodiment are similar to those in the semiconductor device 1 in FIG. 3 in the first embodiment, their explanation will be omitted herein. In this case, there may be employed the modes in which various modifications and variations that are similar to the first embodiment are applied.

(Fourth Embodiment)

Figure 14:
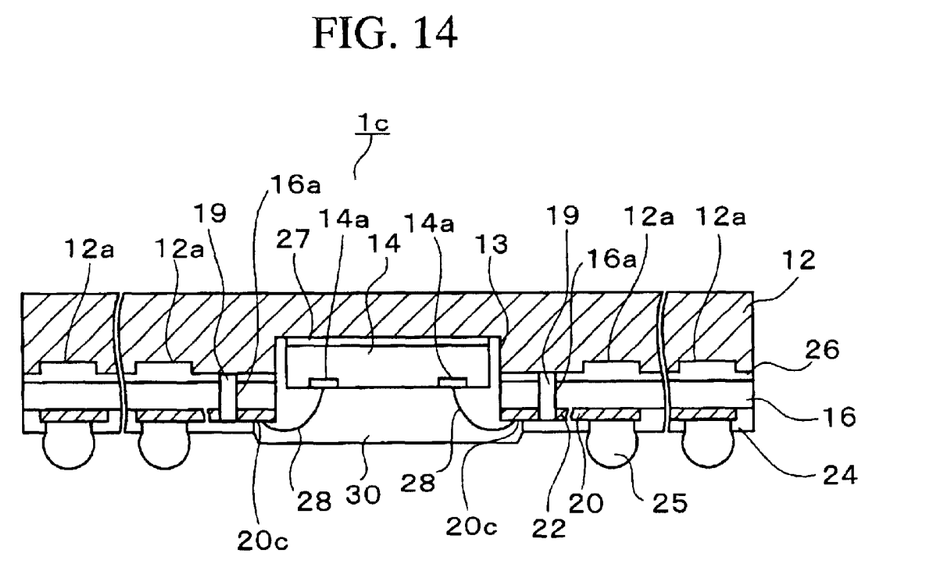
FIG. 14 is a sectional view showing a semiconductor package (semiconductor device) according to a fourth embodiment of the present invention.

FIG. 14 is a sectional view showing a semiconductor package (semiconductor device) according to a fourth embodiment of the present invention. A difference of the fourth embodiment from the first embodiment resides in that the ground plane of the wiring substrate is omitted and the stiffener is commonly used as the ground plane. Therefore, the same symbols are affixed to the same elements as those in FIG. 3, and their explanation will be omitted herein.

As shown in FIG. 14, in a semiconductor package (semiconductor device 1c) of the fourth embodiment, the signal wiring layers 20 and the ground wiring layer 22 that are similar to those in the first embodiment are formed on one surface of the insulating film 16. In contrast, unlike the first embodiment, the ground plane is not formed on the other surface of the insulating film 16. The other surface of the insulating film 16 is adhered to the stiffener 12 via the resin layer 26.

Also, the ground wiring layer 22 is connected electrically to the stiffener 12 via the through holes 16a, into which the conductive paste 19 is filled, to constitute the equal potential ground. That is, the stiffener 12 functions not only as the radiating plate and the supporting plate but also as the ground plane 18 in the first embodiment. In this case, like the variation of the first embodiment, the side surface of the termination portion of the ground wiring layer 22 and the stiffener 12 may be connected by the conductive paste without the formation of the through holes 16a.

Also, like the first embodiment, the recess portions 12a, whose depth is adjusted to get the impedance matching between the wiring line portion 20a and the connection pad portions 20b of the signal wiring layers 20, are formed in portions of the stiffener 12, which correspond to the connection pad portions 20b. Like the first embodiment, the predetermined resin layer 26 is filled into the recess portions 12a. Otherwise, the mode in which the hollow portion is provided in the recess portions 12a may be employed.

In the semiconductor package (semiconductor device 1c) of the fourth embodiment, the stiffener 12 is also used as the ground plane without provision of the ground plane 18 on the wiring substrate 10. Therefore, a configuration of the semiconductor package can be simplified and its production cost can be reduced. In this case, like the first embodiment, there may be employed the modes in which various modifications and variations that are similar to the first embodiment are applied.

(Fifth Embodiment)

Figure 15:
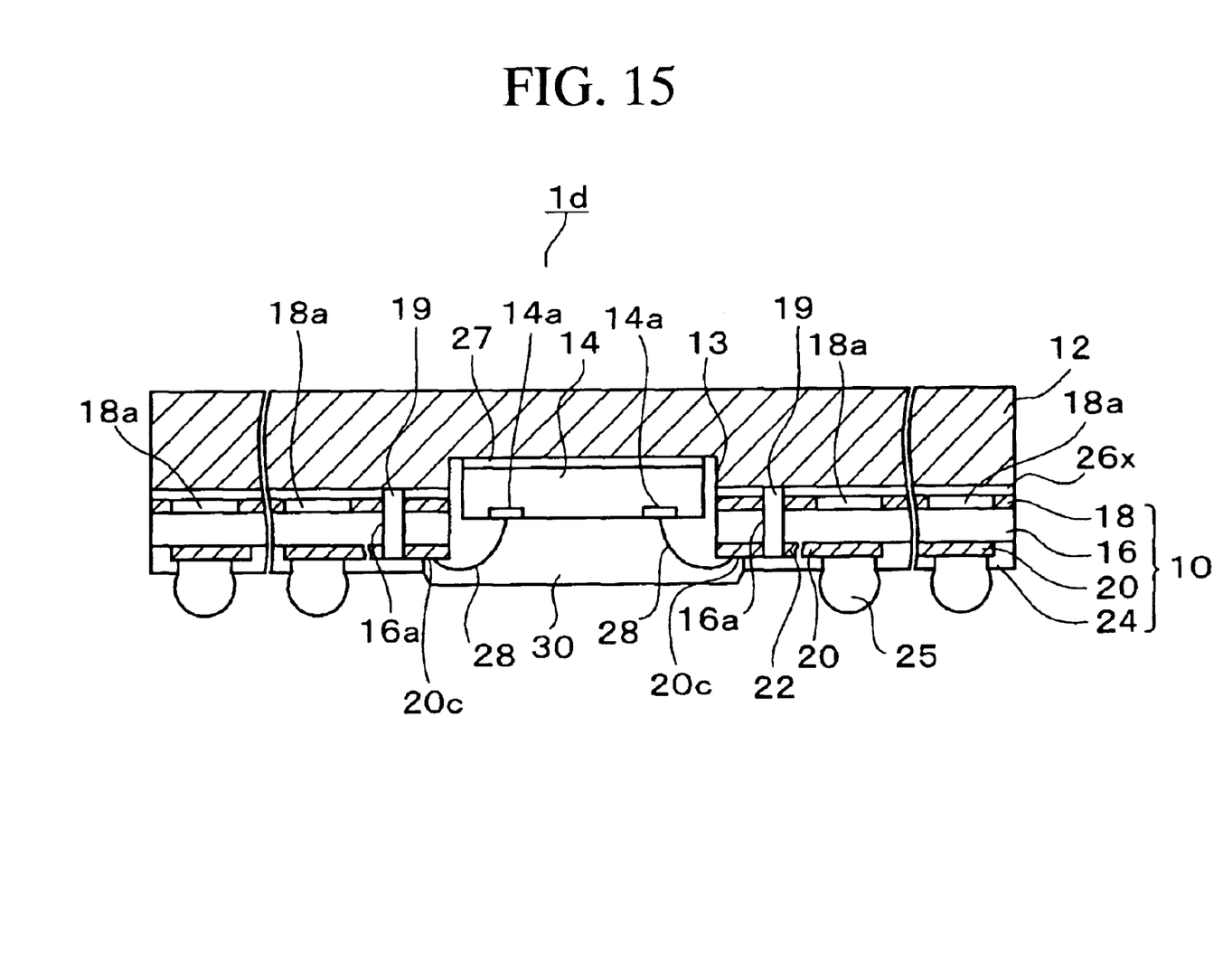
FIG. 15 is a sectional view showing a semiconductor package (semiconductor device) according to a fifth embodiment of the present invention.
Figure 16:
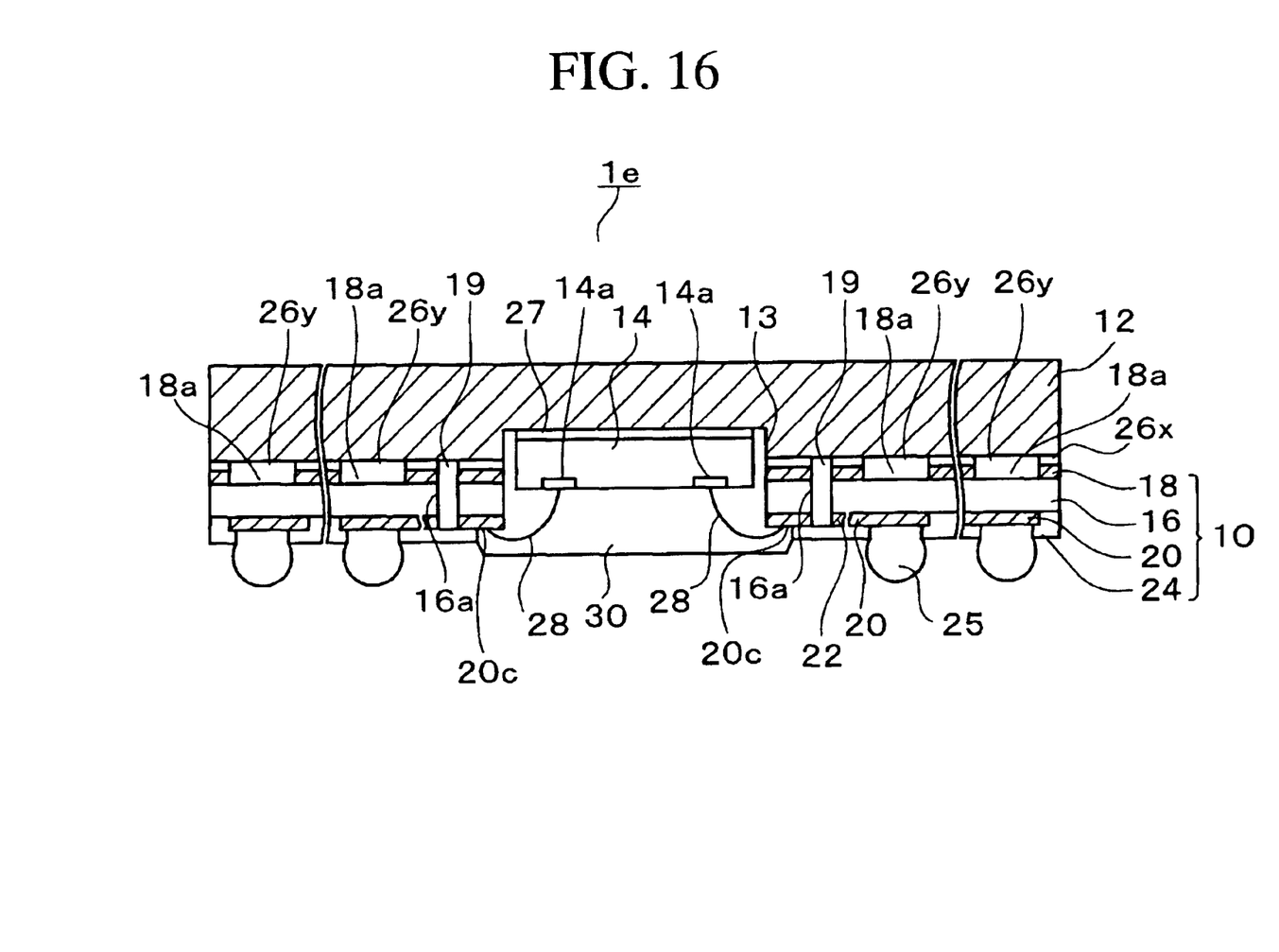
FIG. 16 is a sectional view showing a semiconductor package (semiconductor device) according to a first variation of the fifth embodiment of the present invention.
Figure 17:
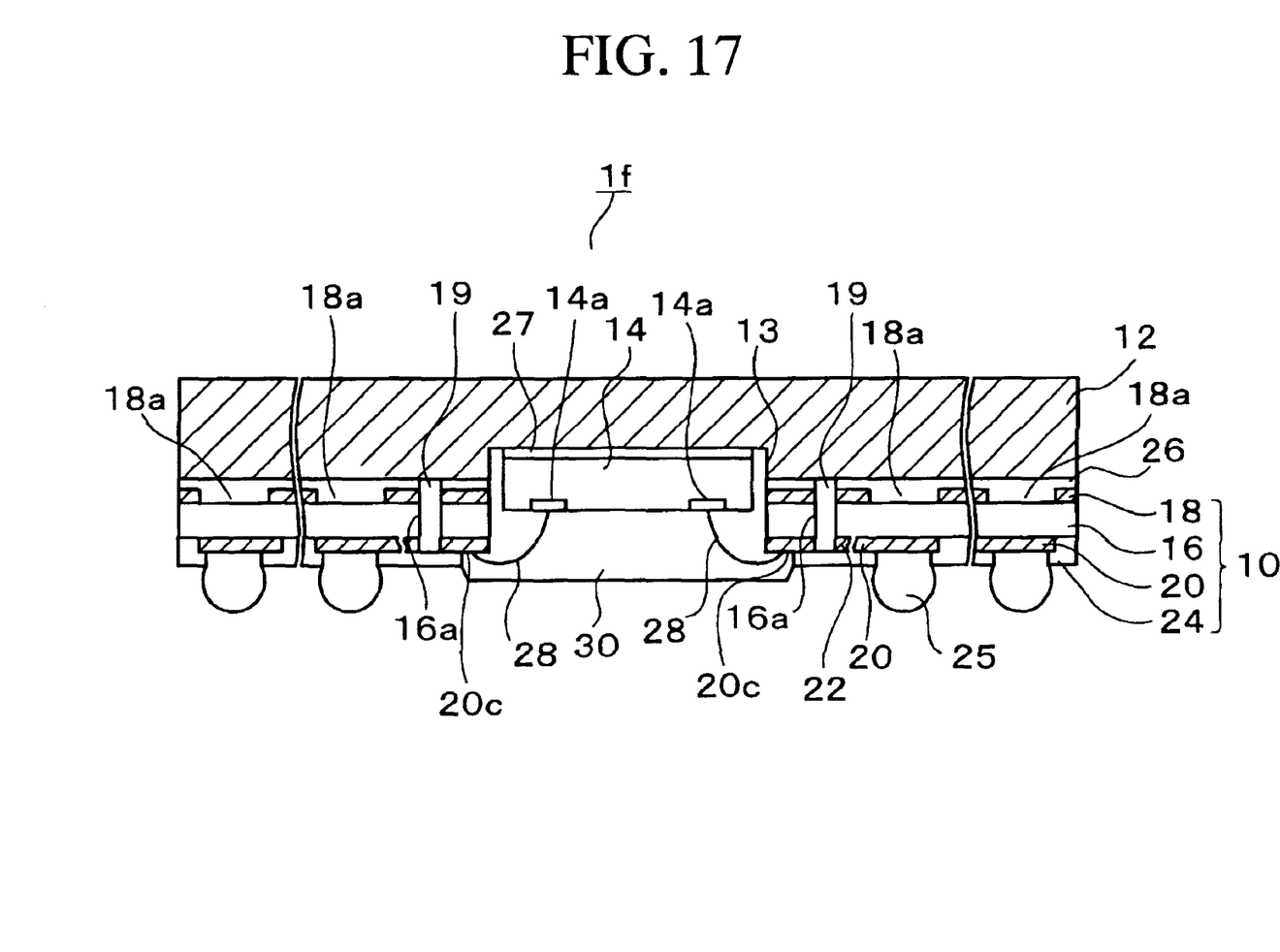
FIG. 17 is a sectional view showing a semiconductor package (semiconductor device) according to a second variation of the fifth embodiment of the present invention.

FIG. 15 to FIG. 17 are sectional views showing a semiconductor package (semiconductor device) according to a fifth embodiment of the present invention respectively. A difference of the fifth embodiment from the first embodiment resides in that no recess portion is provided in the stiffener and that the non-forming portion is provided only in the portions of the ground plane, which correspond to the connection pads 20b of the signal wiring layers 20. In this case, in FIG. 15 to FIG. 17, the same symbols are affixed to the same elements as those in FIG. 3 in the first embodiment, and their explanation will be omitted herein.

As shown in FIG. 15, in a semiconductor package (semiconductor device 1d) of the fifth embodiment, unlike the first embodiment, the recess portions are not particularly formed in the stiffener 12 (metal plate), and the non-forming portions 18a are provided in portions of the ground plane 18, which correspond to the connection pads 20b (FIG. 4) of the signal wiring layers 20.

A surface of the wiring substrate 10 on the ground plane 18 side is adhered to the stiffener 12 via an adhesive sheet 26x (resin layer), and the non-forming portions 18a of the ground plane 18 are formed as a hollow. That is, it has a structure in which the adhesive sheet 26x is interposed between the non-forming portions (hollow portions) 18a of the ground plane 18 and the stiffener 12.

In the semiconductor package of the fifth embodiment, a thickness of the adhesive sheet 26x having a predetermined relative dielectric constant, a depth of the non-forming portion 18a of the ground plane 18 (corresponding to a thickness of the ground plane 18), or both of them are adjusted appropriately such that the electrostatic capacities that are formed in the wiring line portions 20a and the connection pad portions 20b respectively become substantially equal. Therefore, the impedance matching can be attained between the wiring line portions 20a and the connection pad portions 20b.

In particular, the adhesive sheets 26x having various thicknesses can be easily prepared. Therefore, if the diameter of the connection pad portion 20b, etc. are changed, the impedance matching can be attained easily by adjusting the thickness of the adhesive sheet 26x without change of the depth of the non-forming portion 18a (thickness of the ground plane 18).

Also, as shown in FIG. 16, in a semiconductor package (semiconductor device 1e) according to a first variation of the fifth embodiment, in the structure in FIG. 15, opening portions 26y are formed in portions of the adhesive sheet 26x (resin layer), which correspond to the non-forming portion 18a of the ground plane 18. Both the non-forming portion 18a of the ground plane 18 and the opening portions 26y in the adhesive sheet 26x are formed as a hollow.

Such structure can be obtained by adhering the wiring substrate 10 and the stiffener 12 via the adhesive sheet 26x in which the opening portions 26y are formed in portions that coincide with the non-forming portions 18a of the ground plane 18.

In the first variation of the fifth embodiment, the thickness of the overall hollow portion is optimized by adjusting appropriately a depth of the opening portions 26y of the adhesive sheet 26x, a depth of the non-forming portions 18a (hollow portions) of the ground plane 18, or both of them according to the diameter of the connection pad portion 20b, etc., and thus the impedance matching can be obtained between the wiring line portions 20a and the connection pad portions 20b. In the case of a first variation, for the same reason as the above embodiment, it is important that the impedance matching must be obtained by changing the thickness of the adhesive sheet 26x to adjust the thickness of the overall hollow portion.

Also, as shown in FIG. 17, in a semiconductor package (semiconductor device 1f) according to a second variation of the fifth embodiment, the surface of the wiring substrate 10 on the ground plane 18 side is adhered to the stiffener 12 via the resin layer 26 and the non-forming portions 18a of the ground plane 18 are filled with the resin layer 26. Such structure can be obtained since the soft resin layer 26 is pushed and then filled into the non-forming portions 18a of the ground plane 18 when the stiffener 12 and the wiring substrate 10 are adhered via the soft resin layer 26.

In the second variation of the fifth embodiment, the thickness of the adhesive layer 26, which is interposed between the insulating film 16 and the stiffener 12 over the connection pad portion 20b, is adjusted according to the diameter of the connection pad portion 20b, etc., and thus the impedance matching can be obtained between the wiring line portions 20a and the connection pad portions 20b.

The semiconductor packages (semiconductor devices 1d, 1e, 1f) of the fifth embodiment can achieve the same advantages as the first embodiment, and also can make the structure of the semiconductor package simpler than the first embodiment because it is not particularly needed that the recess portions should be formed in the stiffener 12.

In this case, like the first embodiment, there may be employed the modes in which various modifications and variations are applied. Also, like the second and third embodiments, the flat-plate stiffener may be employed, or the present embodiment may be applied to the LGA type semiconductor package by omitting the solder balls.

(Sixth Embodiment)

Figure 18:
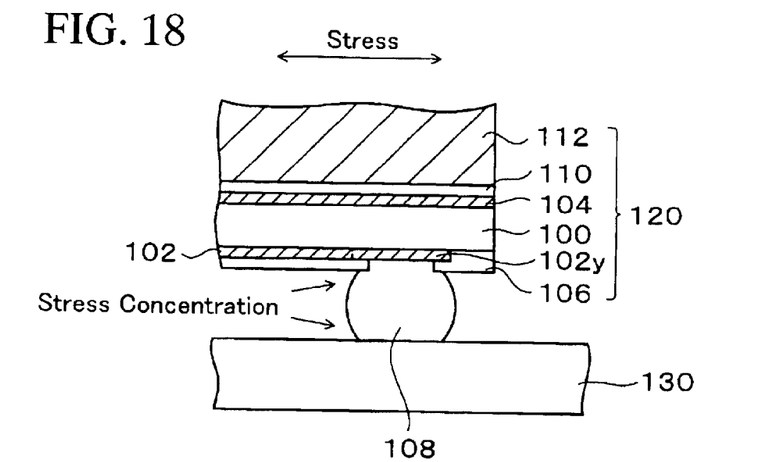
FIG. 18 is a partial sectional view showing the behavior that the stress is applied to the semiconductor device packaged in the packaging substrate in the related art.
Figure 19:
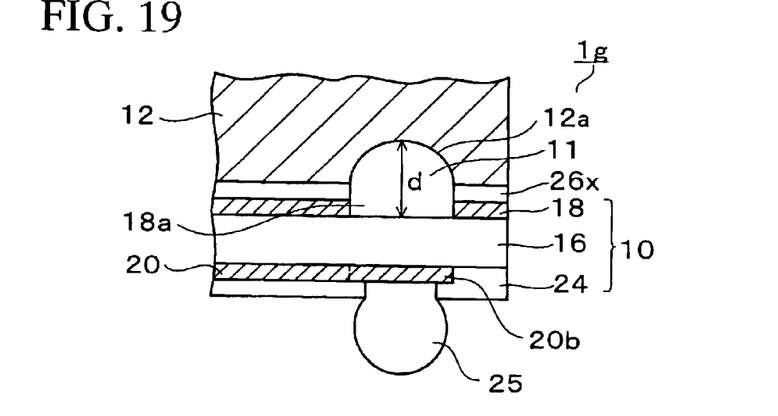
FIG. 19 and FIG. 20 are sectional views showing a semiconductor package (semiconductor device) according to a sixth embodiment of the present invention.
Figure 20:
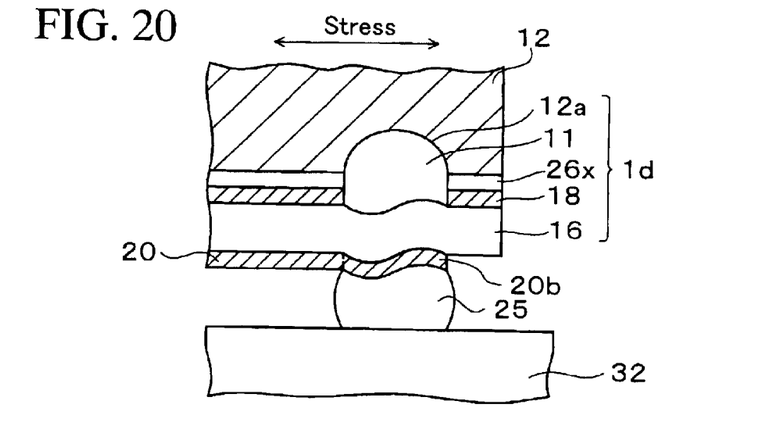

FIG. 18 is a partial sectional view showing the behavior that the stress is applied to the semiconductor device packaged in the packaging substrate in the related art, and FIG. 19 and FIG. 20 are sectional views showing a semiconductor package (semiconductor device) according to a sixth embodiment of the present invention. In FIG. 19 and FIG. 20, the same symbols are affixed to the same elements as those in FIG. 3 in the first embodiment, and their explanation will be omitted herein.

As shown in FIG. 18, in the electronic parts in which a semiconductor device 120 (FIG. 1) having the FBGA package structure in the related art is packaged on packaging substrate (mother board) 130, if a stress is applied to the semiconductor device 120 in the horizontal direction, the stress concentrates onto the neighboring area of a jointed portion of a solder ball 108 (bump). Therefore, since the stress is applied to the neighborhood of a connection pad 102y connected to the solder ball 108, it is possible that cracks, etc. are generated in a signal wiring layer 102 and thus the signal wiring layer 102 is disconnected. The semiconductor package according to the sixth embodiment can be invented to overcome such disadvantage.

As shown in FIG. 19, a semiconductor package (semiconductor device) 1g of the sixth embodiment is constructed in the similar way to the semiconductor device 1 in the first embodiment. A surface of the wiring substrate 10 on which the ground plane 18 is formed is adhered to a peripheral portion of the stiffener 12 except the chip mounting portion via the adhesive sheet 26x. The insulating film 16 constituting the wiring substrate 10 is made of a resin film such as polyimide, epoxy, or the like having the flexibility.

Then, the non-forming portions 18a are formed in the portions of the ground plane 18, which correspond to the connection pad portions 20b on which the solder balls 25 are mounted. In addition, recess portions 12a are formed in the portions of the stiffener 12, which correspond to the non-forming portions 18a. In FIG. 19, a mode in which a hollow portion 11 is provided in the recess portion 12a is exemplified.

As the result of doing this, as shown in FIG. 20, if the solder ball 25 is jointed to and mounted on a packaging substrate 32 and then the stress is applied to the semiconductor device 1d in the horizontal direction, the stress that concentrated onto the solder ball 25 can be absorbed by the insulating film 16 because the insulating film 16 having the flexibility is bent toward the recess portion 12a side and is deformed.

Therefore, even when the stress is applied to the solder ball 25 in the horizontal direction, generation of the disadvantages such that the cracks are generated in the signal wiring layers 20 containing the connection pad portions 20b, which are connected to the solder ball 25, to disconnect the wiring, etc. can be prevented. At the same time, since the stress applied to the connection pad on the packaging substrate 32 can be relaxed, the reliability of wirings on the packaging substrate 32 can be improved.

In this manner, in the sixth embodiment, the recess portions 12a may be formed such that, when the stress is applied to the solder balls 25, portions of the insulating film 16 corresponding to the areas on which the solder balls 25 are arranged are bent and deformed with an extent that the portions can absorb the stress.

In this case, the mode in which the hollow portion 11 is provided to the recess portions 12a of the stiffener 12 is shown. But there may be employed the mode in which a low hardness body that does not disturb deformation of the insulating film 16 is filled in the recess portions 12a. As the low hardness body, elastic body of chloroprene synthetic rubber base, phenol base resin, etc. may be employed. This low hardness body is filled in the recess portions 12a, and may also be used as the adhesive layer that adheres the wiring substrate 10 and the stiffener 12.

Also, the hemispherical shape is exemplified as the shape of the recess portions 12a of the stiffener 12. The cylindrical type, the cone-type, or the like explained in the first embodiment may be employed. Also, like the fourth embodiment, the present embodiment may be applied to the semiconductor device having the wiring substrate on which no ground plane is formed, Also, if a size of the recess portion 12a of the stiffener 12, a dielectric constant in the recess portion 12a, etc. are adjusted appropriately in combination with the first embodiment, or the like, the semiconductor package (semiconductor device) capable of attaining the impedance matching and also relaxing the stress applied to the solder balls 25 may be constructed.

As above, details of the present invention are explained. But the scope of the present invention is not limited to examples shown concretely in the above embodiments, variations of the above embodiments in the range not to depart from the present invention should be contained in the scope of the present invention.

For example, in the first to fifth embodiments, the modes in which the insulating film 16 is used as the core substrate of the wiring substrate 10 are exemplified. But a rigid substrate such as a glass epoxy substrate, or the like may be employed.

Also, in the sixth embodiment, the insulating film is not limited to the resin film such as polyimide, epoxy, or the like. Any flexible substrate, if such substrate has flexibility, can be applied.

What is claimed is:

1. A semiconductor package comprising:
   a metal plate; and
   a wiring substrate including an insulating substrate, signal wiring layers formed on a one surface of the insulating substrate, and a ground plane formed integrally on another surface of the insulating substrate, the wiring substrate whose surface of the ground plane side is adhered onto the metal plate;
   wherein the signal wiring layer is constructed by a wiring line portion and a connection pad portion whose width is thicker than a width of the wiring line portion, and a non-forming portion is provided in a portion of the ground plane, which corresponds to the connection pad portion.

2. A semiconductor package according to claim 1, wherein the non-forming portion of the ground plane is formed as a hollow, or is filled with a resin layer.

3. A semiconductor package according to claim 1, wherein the non-forming portion of the ground plane is formed as a hollow, and a resin layer is interposed between the non-forming portion and the metal plate.

4. A semiconductor package according to claim 3, wherein the resin layer is adjusted to have a thickness that attains an impedance matching between the wiring line portion and the connection pad portion.

5. A semiconductor package according to claim 1, wherein a recess portion is further provided in a portion of the metal plate, which corresponds to the non-forming portion of the ground plane.

6. A semiconductor package according to claim 1, further comprising:

a ground wiring layer formed on the one surface of the insulating substrate adjacently to the signal wiring layer; and wherein the ground wiring layer, the ground plane, and the metal plate are electrically connected mutually to constitute an integral equal-potential ground.

7. A semiconductor package according to claim 6, wherein the ground wiring layer and the ground plane and the metal plate are connected electrically via a through hole in which a conductor is filled.

8. A semiconductor package according to claim 6, wherein the ground wiring layer and the ground plane and the metal plate are connected electrically by a conductor that is provided in an area that reaches the metal plate from a side wall of an end portion of the wiring substrate, in which side surfaces of the ground wiring layer and the ground plane are exposed.

9. A semiconductor package according to claim 5, wherein the non-forming portion of the ground plane and the recess portion of the metal plate are formed as a hollow, or are filled with a resin layer.

10. A semiconductor package comprising:

a metal plate; and a wiring substrate including an insulating substrate, and a signal wiring layer formed on a one surface of the insulating substrate, the wiring substrate whose another surface is adhered onto the metal plate;

wherein the signal wiring layer is constructed by a wiring line portion and a connection pad portion whose width is thicker than a width of the wiring line portion, and a recess portion is provided in a portion of the metal plate, which corresponds to the connection pad portions.

11. A semiconductor package according to claim 10, further comprising:

a ground wiring layer formed on the one surface of the insulating substrate adjacently to the signal wiring layer; and wherein the ground wiring layer and the metal plate are electrically connected mutually to constitute an integral equal-potential ground.

12. A semiconductor package according to claim 10, wherein the recess portion of the metal plate is formed as a hollow, or is filled with a resin layer.

13. A semiconductor package according to claim 5, wherein the recess portion of the metal plate is formed to have a cylindrical, hemispherical, or cone-type shape.

14. A semiconductor package according to claim 5, wherein the recess portion of the metal plate is adjusted to have a depth that attains an impedance matching between the wiring line portion and the connection pad portion.

15. A semiconductor package comprising:

a metal plate; and a wiring substrate including a film substrate, and a signal wiring layer formed on a one surface of the film substrate and the signal wiring layer having a connection pad portion which is jointed to a bump, the film substrate whose another surface is adhered onto the metal plate;

wherein stress applied to the bump is relaxed by providing a recess portion in a portion of the metal plate, which corresponds to the connection pad portion.

16. A semiconductor package according to claim 15, further comprising:

a ground plane formed integrally on another surface of the film substrate; and wherein a non-forming portion is provided in a portion of the ground plane, which corresponds to the connection pad portion.

17. A semiconductor package according to claim 15, wherein the recess portion of the metal plate is formed as a hollow, or is filled with an elastic body or phenol resin.

18. A semiconductor package according to claim 1, wherein the metal plate has a chip mounting portion on which a semiconductor chip is mounted in a predetermined center portion, and the wiring substrate is adhered to a peripheral portion of the metal plate except the chip mounting portion.

19. A semiconductor device comprising:

the semiconductor package set forth in claim 18; and a semiconductor chip having a connection electrode on a surface side, wherein a back surface side of the semiconductor chip is adhered onto the chip mounting portion, and the connection electrode is connected electrically to a wiring layer of the one surface of the wiring substrate.

20. A semiconductor device according to claim 19, wherein a cavity is provided in the chip mounting portion of the metal plate of the semiconductor package, and the semiconductor chip is adhered onto a bottom portion of the cavity.

21. A semiconductor device according to claim 19, further comprising: a bump jointed to the connection pad portion of the one surface of the wiring substrate.

* * * * *